United States Patent
Lin et al.

(10) Patent No.: US 9,607,712 B1
(45) Date of Patent: Mar. 28, 2017

(54) SHIFT REGISTER GROUP

(71) Applicant: AU OPTRONICS CORP., Hsin-Chu (TW)

(72) Inventors: Wei-Li Lin, Hsin-Chu (TW); Che-Wei Tung, Hsin-Chu (TW); Chia-Heng Chen, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/358,939

(22) Filed: Nov. 22, 2016

Related U.S. Application Data

(63) Continuation of application No. 14/324,527, filed on Jul. 7, 2014.

(30) Foreign Application Priority Data

Mar. 10, 2014 (TW) .............................. 103108153 A

(51) Int. Cl.
  *G09G 3/20* (2006.01)
  *G11C 19/28* (2006.01)
  *G09G 5/00* (2006.01)

(52) U.S. Cl.
  CPC ........... *G11C 19/287* (2013.01); *G09G 5/003* (2013.01); *G09G 2310/0286* (2013.01); *G09G 2310/06* (2013.01); *G09G 2310/08* (2013.01)

(58) Field of Classification Search
  CPC ... G11C 19/28; G11C 19/287; G09G 2330/06
  See application file for complete search history.

(56) References Cited

U.S. PATENT DOCUMENTS

| | | | |
|---|---|---|---|
| 8,494,108 B2 | 7/2013 | Hsu et al. | |
| 8,605,027 B2* | 12/2013 | Pak ...................... | G09G 3/3677 315/169.2 |
| 2005/0078057 A1* | 4/2005 | Chang ................. | G02F 1/13454 345/55 |
| 2007/0007557 A1* | 1/2007 | Kwak .................. | G09G 3/3677 257/239 |
| 2007/0104307 A1* | 5/2007 | Kim ...................... | G11C 19/28 377/64 |
| 2008/0187089 A1* | 8/2008 | Miyayama ............. | G11C 19/28 377/79 |
| 2011/0221736 A1* | 9/2011 | Pak ...................... | G09G 3/3677 345/211 |

(Continued)

FOREIGN PATENT DOCUMENTS

CN 103606359 A 2/2014

OTHER PUBLICATIONS

State Intellectual Property Office of the People's Republic of China, "Office Action", issued on Dec. 15, 2015.

*Primary Examiner* — Priyank Shah
(74) *Attorney, Agent, or Firm* — WPAT, PC; Justin King

(57) ABSTRACT

A shift register group includes a plurality of series-coupled shift registers each being configured to provide an output signal. The third control signal of a first sift register of the plurality of shift registers is the output signal provided by the shift register N stages after the first shift register, and the fourth control signal of the first sift register is the voltage at the driving node of the shift register 2N stages after the first shift register, wherein N is a natural number. A driving method of the aforementioned shift register group is also provided.

9 Claims, 15 Drawing Sheets

(56) References Cited

U.S. PATENT DOCUMENTS

| | | | |
|---|---|---|---|
| 2012/0098800 A1* | 4/2012 | Kim | G09G 3/3677 345/204 |
| 2012/0146978 A1* | 6/2012 | Park | G11C 19/287 345/211 |
| 2012/0256817 A1* | 10/2012 | Chen | G11C 19/28 345/92 |
| 2014/0022228 A1 | 1/2014 | Bae et al. | |
| 2014/0176410 A1 | 6/2014 | Ma et al. | |
| 2014/0355732 A1* | 12/2014 | Lin | G06F 3/041 377/64 |
| 2015/0016584 A1* | 1/2015 | Dun | G11C 27/04 377/68 |
| 2016/0055814 A1* | 2/2016 | Yang | G09G 3/3677 345/213 |

\* cited by examiner

SHIFT REGISTER GROUP

RELATED APPLICATIONS

This is a Continuation Application of U.S. Ser. No. 14/324,527 filed Jul. 7, 2014, which is herein incorporated by reference in its entirety.

TECHNICAL FIELD

The present disclosure relates to a shift register group and a driving method for the same, and more particularly to a shift register group and a driving method for the same having a faster pull-down speed.

BACKGROUND

Compared with the conventional technology of using external silicon wafer for the manufacture of driving chip, Gate Driver on Array (GOA) is a technology for directly manufacturing a gate driver circuit on an array substrate. By using the GOA technology, gate driver circuit can be directly manufactured around a panel, thereby increasing the integration degree of a panel circuit. Therefore, the GOA technology has been widely used for reducing the border width of the display panel.

However, each scan line on a screen is driven by a corresponding gate drive circuit; thus, the output signal, outputted form the gate driver circuit to the respective scan line, must be designed to have a shorter enable period in response to an increasing image frame rate with the high image quality demands. For example, if the output signal outputted from the nth-stage gate driver circuit is still enabled when the scanning of the nth scan line is completed, the image data supposed to supply to the pixels electrically coupled to the (n+1)th scan line is also supplied to the pixels electrically coupled to the nth scan line, an abnormal image may occur. Thus, it is quite necessary to pull down the output signal to non-enable state as quickly as possible once the corresponding scan line is scanned.

SUMMARY

The present disclosure discloses a shift register group, which includes a plurality of series-coupled shift registers each being configured to provide an output signal. Each one of the plurality of shift registers includes a first output terminal, a first output terminal control circuit, a first driving node control circuit and a second driving node control circuit. The first output terminal is configured to provide the output signal. The first output terminal control circuit is electrically coupled to the first output terminal and configured to receive a clock signal and determine whether to transmit the clock signal to the first output terminal or not according to a voltage at a driving node. The first driving node control circuit is electrically coupled to the driving node and configured to receive a first control signal and determine whether to transmit the first control signal to the driving node or not according to a second control signal. The second driving node control circuit is electrically coupled to the driving node and configured to receive a third control signal and determine whether to transmit the third control signal to the driving node or not according to a fourth control signal. The third control signal of a first sift register of the plurality of shift registers is the output signal provided by the shift register N stages after the first shift register, and the fourth control signal of the first sift register is the voltage at the driving node of the shift register 2N stages after the first shift register, wherein N is a natural number.

The present disclosure further discloses a shift register group, which includes a plurality of series-coupled shift registers each being configured to provide an output signal. Each one of the plurality of shift registers includes a first output terminal, a first output terminal control circuit, a first driving node control circuit and a second driving node control circuit. The first output terminal is configured to provide the output signal. The first output terminal control circuit is electrically coupled to the first output terminal and configured to receive a clock signal and determine whether to transmit the clock signal to the first output terminal or not according to a voltage at a driving node. The first driving node control circuit is electrically coupled to the driving node and configured to receive a first control signal and determine whether to transmit the first control signal to the driving node or not according to a second control signal. The second driving node control circuit is electrically coupled to the driving node and configured to receive a third control signal and determine, according to a fourth control signal, whether to have the driving node for performing a specific operation in respond to the third control signal or not. The third control signal of a first sift register of the plurality of shift registers is the output signal provided by the shift register N stages after the first shift register, and the fourth control signal of the first sift register is the voltage at the driving node of the shift register 2N stages after the first shift register, wherein N is a natural number.

The present disclosure still further discloses a driving method for the aforementioned shift register group. The driving method includes steps of: enabling the first control signal corresponding to the first shift register; disabling the first control signal corresponding to the first shift register and enabling the clock signal corresponding to the first shift register; disabling the clock signal corresponding to the first shift register, enabling the third control signal and making the voltage of the driving node close to the voltage of the enabled first control signal; and disabling the third control signal.

In summary, by providing the aforementioned shift register and driving method using the same, the output signal has higher pull-down speed and consequentially the images have maintained quality under a relatively higher frame rate.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
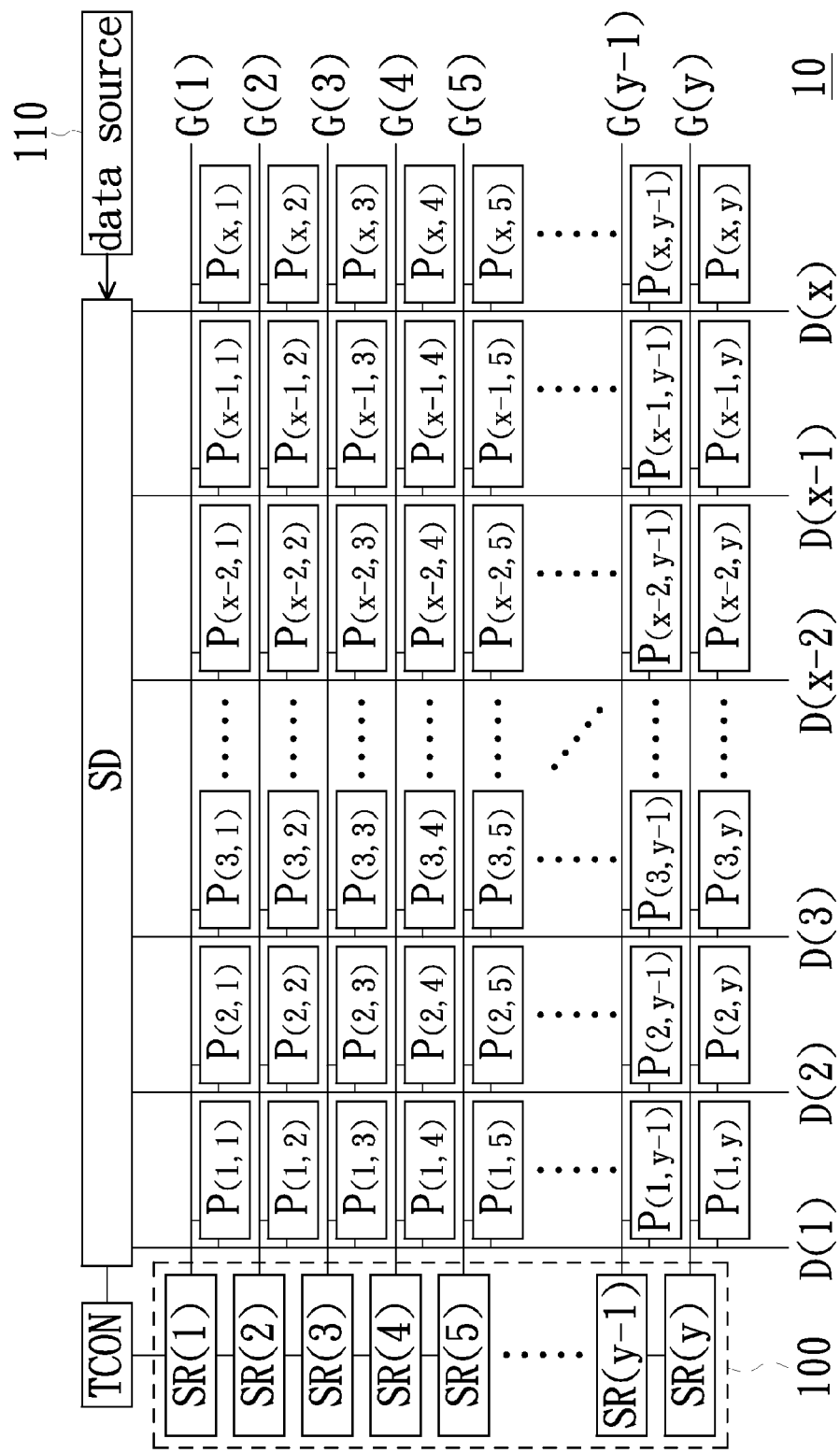
FIG. 1A is a schematic block view of a flat display panel in accordance with an embodiment of the present disclosure.

FIG. 1A is a schematic block view of a flat display panel in accordance with an embodiment of the present disclosure. As shown, the display panel 10 in the present embodiment includes a timing controller TCON, a data driver SD, a shift register group 100, a plurality of data lines D(1)~D(x), a plurality of scan lines for respectively transmitting output signals G(1)~G(y), and a plurality of pixels P(1,1)~P(x,y). The timing controller TCON is configured to provide clock signals and control signals to the data driver SD and the shift register group 100, respectively. Thus, the shift register group 100 can enable the scan lines according to a specific sequence and thereby a portion of the pixels P(1,1)~P(x,y) which are electrically coupled to the enabled scan lines can receive the display data, originally derived from a data source 110, from the data driver SD through the data lines D(1)~D(x), respectively.

In the present embodiment as shown in FIG. 1A, the shift register group 100 includes a plurality of series-coupled shift registers SR(1)~SR(y). The shift registers SR(1)~SR(y) are configured to provide the output signals G(1)~G(y) to the scan lines, respectively, so as to drive the pixels P(1,1)~P(x,y) which are electrically coupled to the enabled scan lines.

Specifically, the shift register SR(1) is configured to, in response to a receiving of the control signal from the timing controller TCON, provide the output signal G(1) to the corresponding scan line, so as to drive the pixels P(1,1), P(2,1), P(3,1) . . . P(x−2,1), P(x−1,1) and P(x,1), which are electrically coupled to this corresponding scan lines, to receive the display data from the data lines D(1), D(2), D(3) . . . D(x−2), D (x−1) and D(x), respectively. It is to be noted that in the present embodiment as shown in FIG. 1A, the control signal outputted from the timing controller TCON is transmitted from the shift register SR(1) to the shift register SR(y) sequentially through the SR(2)~SR(y−1). In other words, after the shift register SR(1) provides the output signal G(1) to the corresponding scan line, the control signal, initially derived from the timing controller TCON, is further transmitted from the shift register SR(1) to the shift register SR(2). And similarly, the shift register SR(2) is configured to, in response to a receiving of the control signal from the shift register SR(1), provide the output signal G(2) to the corresponding scan line, so as to drive the pixels P(1,2), P(2,2), P(3,2) . . . P(x−2,2), P(x−1,2) and P(x,2), which are electrically coupled to this corresponding scan lines, to receive the display data from the data lines D(1), D(2), D(3) . . . D(x−2), D (x−1) and D(x), respectively. The remaining shift registers SR(3)~SR(y) are configured according to the aforementioned manner, and no redundant detail is to be given herein.

It is understood that the display data can be relatively quickly written into the pixels P(1,1)~P(x,y) if the voltage levels of the output signals G(1)~G(y) respectively outputted from the shift registers SR(1)~SR(y) can be relatively quickly pulled up. In addition, the display data can be relatively stably stored in the respective pixel as well as the next data writing operation can be relatively quickly performed if the voltage level of the respective output signal can be relatively quickly pulled down. Thus, the circuit characteristic of the shift register is tightly related to the performance of the display device.

Figure 1B:
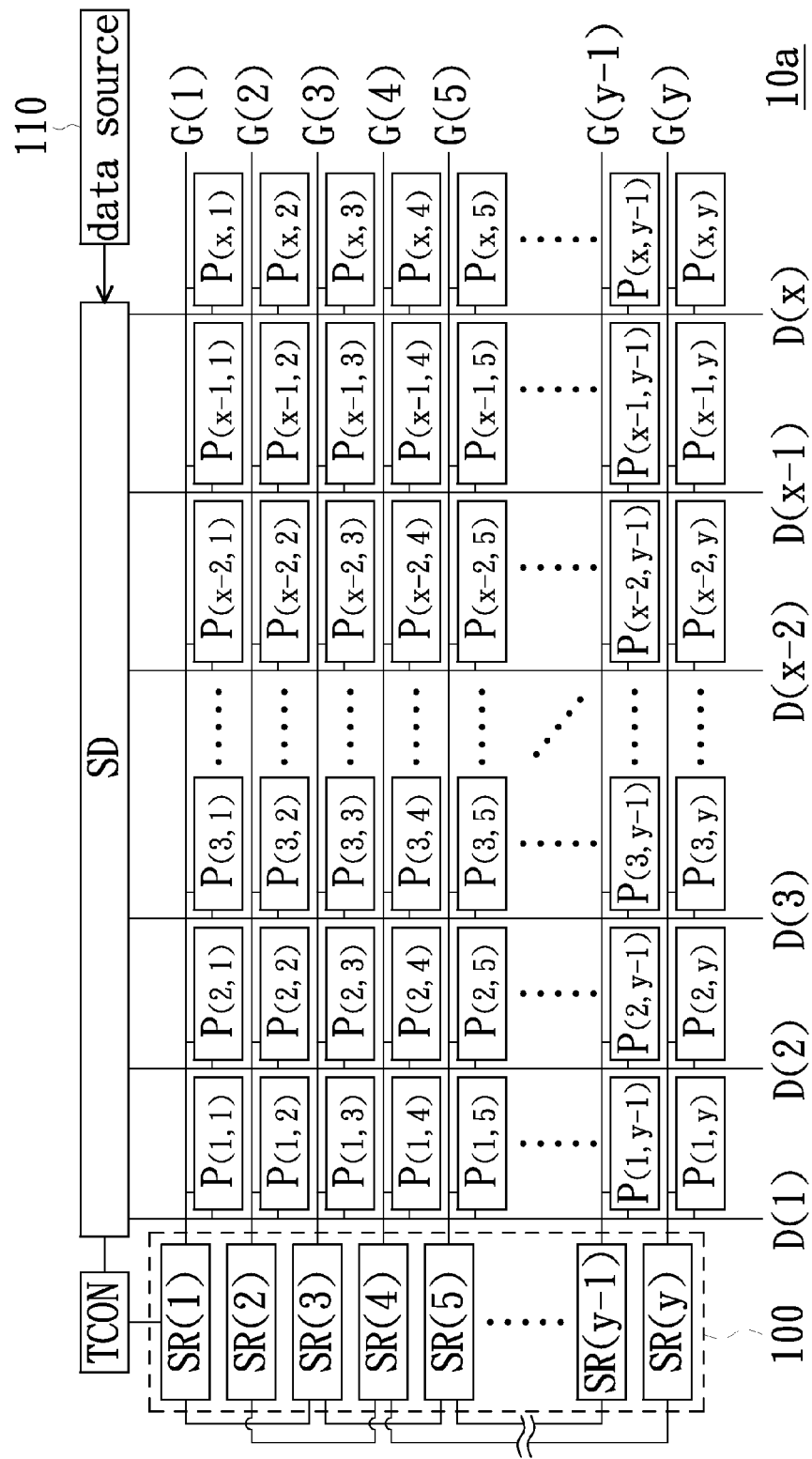
FIG. 1B is a schematic block view of a flat display panel in accordance with another embodiment of the present disclosure.

FIG. 1B is a schematic block view of a flat display panel in accordance with another embodiment of the present disclosure. Compared with the flat display panel of FIG. 1A, the control signal in the flat display panel 10a in the present embodiment is transmitted from the shift register SR(n) to the shift register SR(n+2). For example, the control signal supplied to the shift register SR(1) is further transmitted to the shift register SR(3) and the control signal supplied to the shift register SR(2) is further transmitted to the shift register SR(4). The function and circuit structure of other parts of the flat display panel 10a are similar to that of the flat display panel 10, and no redundant detail is to be given herein.

Figure 2:
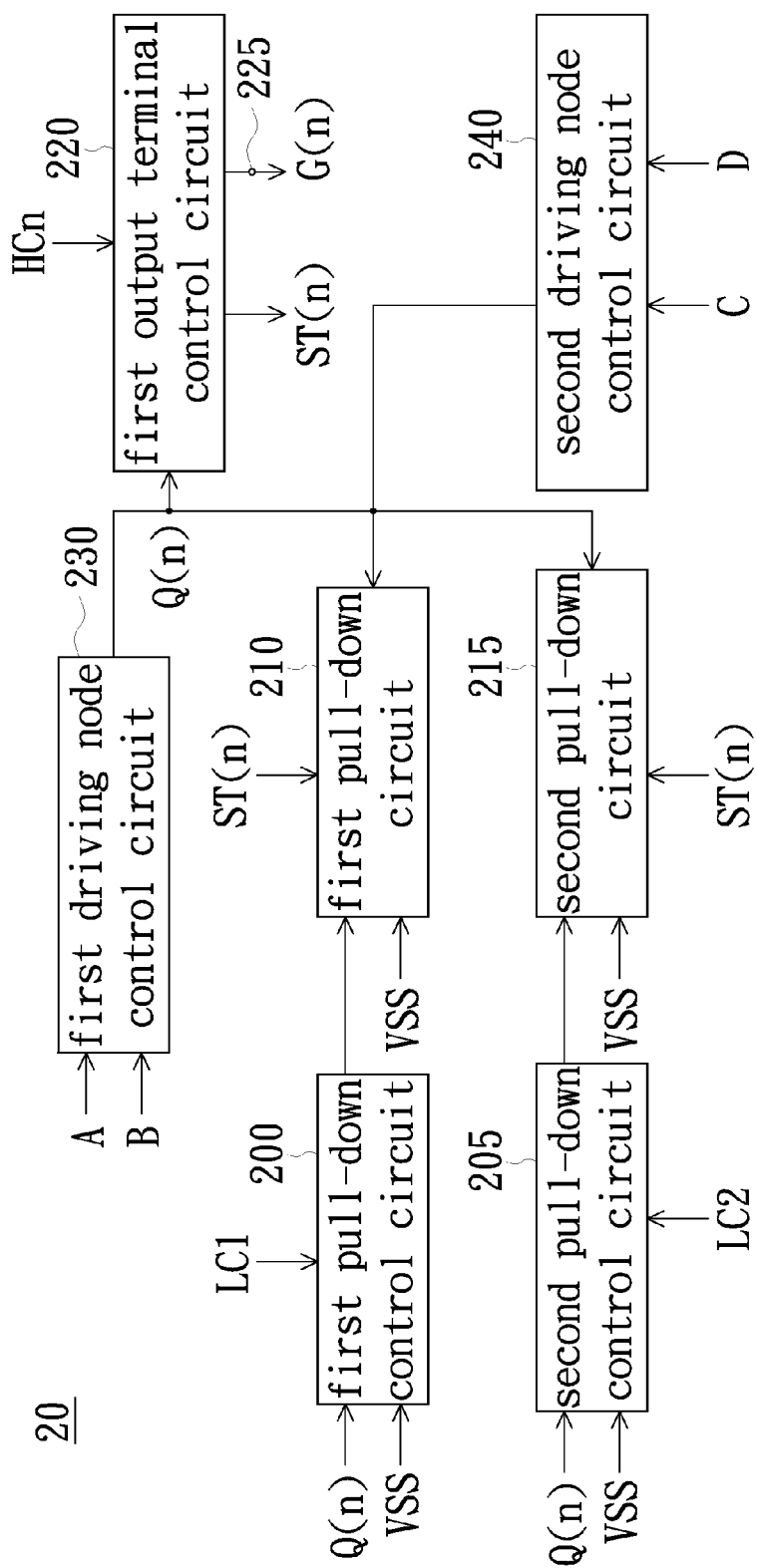
FIG. 2 is a schematic block view of a shift register in accordance with an embodiment of the present disclosure.

FIG. 2 is a schematic block view of one of the shift registers arranged in the shift register group in FIGS. 1A and 1B in accordance with an embodiment of the present disclosure; wherein the shift register is exemplarily referred to the nth-stage shift register in the shift register group. As shown, the shift register 20 in the present embodiment includes a first output terminal control circuit 220, a first driving node control circuit 230 and a second driving node control circuit 240. In addition, the shift register 20 in the present embodiment further includes a first pull-down control circuit 200, a second pull-down control circuit 205, a first pull-down circuit 210 and a second pull-down circuit 215, which are corporately functioned as a stable circuit. The first pull-down control circuit 200 is configured to control, according to the voltage at the driving node Q(n) and the input signal LC1, the first pull-down circuit 210 to stably maintain the voltage at the driving node Q(n) within a predetermined range in a specific period. Similarly, the second pull-down control circuit 205 is configured to control, according to the voltage at the driving node Q(n) and the input signal LC2, the second pull-down circuit 215 to stably maintain the voltage at the driving node Q(n) within a predetermined range in a specific period. Specifically, when being controlled by the first pull-down control circuit 200 to perform an operation for stabilizing the voltage at the driving node Q(n), the first pull-down circuit 210 is configured to determine the voltage at the driving node Q(n) according to the startup signal ST(n) provided by the first output terminal control circuit 220. Similarly, when being controlled by the second pull-down control circuit 205 to perform an operation for stabilizing the voltage at the driving node Q(n), the second pull-down circuit 215 is configured to determine the voltage at the driving node Q(n) according to the startup signal ST(n). In general, the first pull-down circuit 210 and the second pull-down circuit 215 are enabled alternately so that both of the first pull-down circuit 210 and the second pull-down circuit 215 have extended electronic component lives.

Besides being controlled by the first pull-down circuit 210 and the second pull-down circuit 215, the voltage at the driving node Q(n) in a specific period is further controlled by the first driving node control circuit 230 and the second driving node control circuit 240.

In the present embodiment, the first driving node control circuit 230 is configured to receive a first control signal A and a second control signal B and determine whether to transmit the first control signal A to the driving node Q(n) or not according to the second control signal B. The second driving node control circuit 240 is configured to receive a third control signal C and a fourth control signal D and determine whether to transmit the third control signal C to the driving node Q(n) or not according to the fourth control signal D. In addition, through controlling the waveform configurations of the voltage at the driving node Q(n) and the clock signal HCn, the output signal G(n) provided from the first output terminal control circuit 220 to a first output terminal 225 is controlled. Or, from another perspective, the first output terminal control circuit 220 is configured to determine whether to transmit the clock signal HCn to the first output terminal 225 or not according to the voltage at the driving node Q(n).

Figure 3:
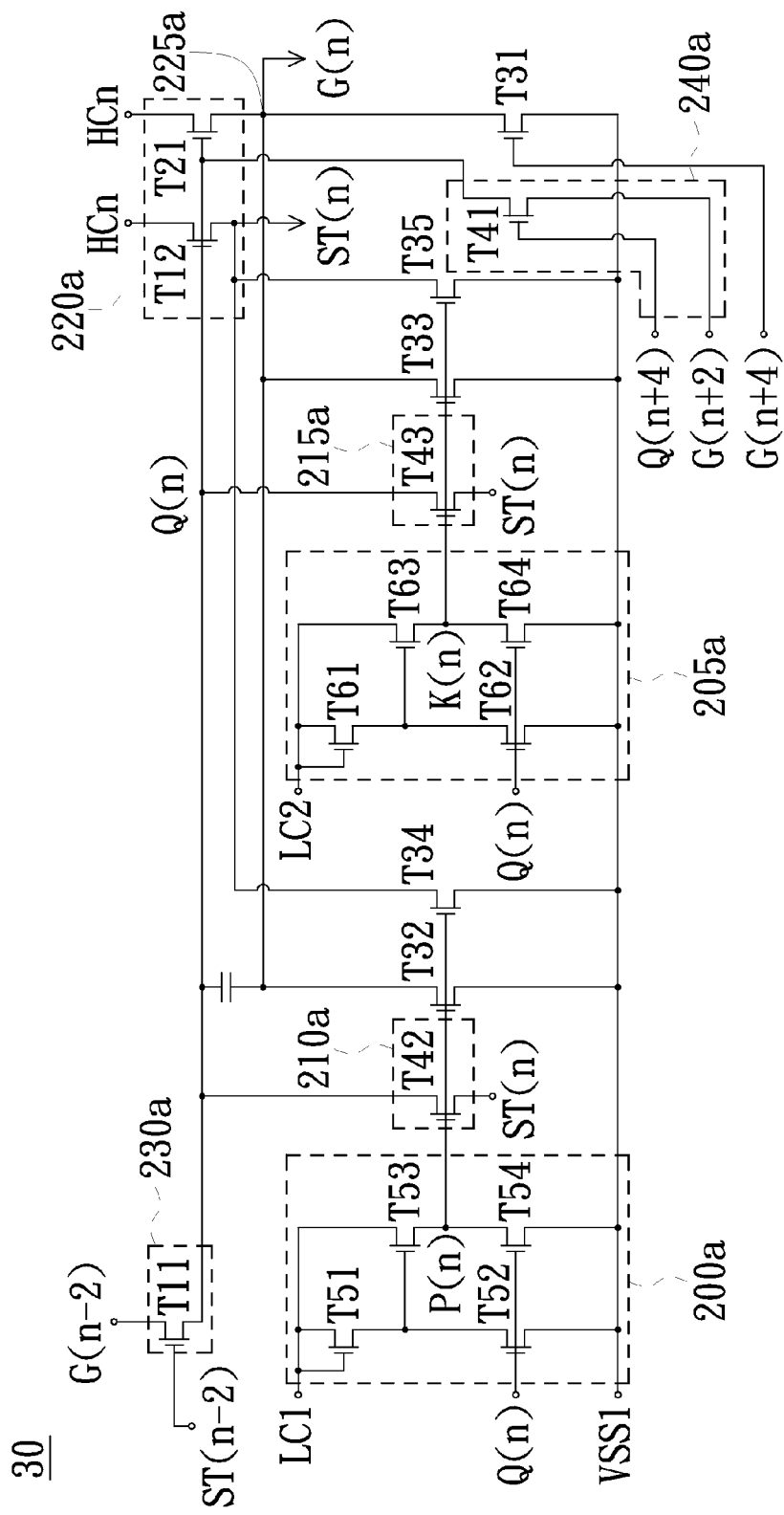
FIG. 3 is a schematic circuit view of a shift register in accordance with an embodiment of the present disclosure.

The aforementioned shift register 20 can be implemented with various circuit structures and associated control signals. FIG. 3 is a schematic circuit view of a shift register in accordance with an embodiment of the present disclosure. As shown, the shift register 30 in the present embodiment has a circuit structure based on the shift register 20 of FIG. 2. However, besides the first pull-down control circuit 200a, the second pull-down control circuit 205a, the first pull-down circuit 210a, the second pull-down circuit 215a, the first output terminal control circuit 220a, the first output terminal 225a, the first driving node control circuit 230a and the second driving node control circuit 240a, the shift register 30 in the present embodiment may further include some specific electronic components, such as capacitors and transistors T31, T32, T33, T34 and T35, which are for stabilizing the circuit characteristics. It is understood that these specific electronic components are optional in another embodiment, and the actual circuit structure can be modulated based on the actual circuit requirements.

In the present embodiment, the first pull-down control circuit 200a includes transistors T51, T52, T53 and T54. The gate terminal of the transistor T51, the first channel terminal of the transistor T51 and the first channel terminal of the transistor T53 are electrically coupled together and for receiving the input signal LC1. The second channel terminal of the transistor T51, the first channel terminal of the transistor T52 and the gate terminal of the transistor T53 are electrically coupled together. The second channel terminal of the transistor T53 and the first channel terminal of the transistor T54 are electrically coupled to the node P(n). The voltage at the driving node Q(n) is supplied to the gate terminal of the transistor T52 and the gate terminal of the transistor T54; wherein the gate terminal of the transistor T52 and the gate terminal of the transistor T54 are electrically coupled together. The second channel terminal of the transistor T52 and the second channel terminal of the transistor T54 are electrically coupled together to a predetermined voltage VSS1 (e.g., −10V). The second pull-down control circuit 205a includes transistors T61, T62, T63 and T64. The gate terminal of the transistor T61, the first channel terminal of the transistor T61 and the first channel terminal of the transistor T63 are electrically coupled together and for receiving the input signal LC2. The second channel terminal of the transistor T61, the first channel terminal of the transistor T62 and the gate terminal of the transistor T63 are electrically coupled together. The second channel terminal of the transistor T63 and the first channel terminal of the transistor T64 are electrically coupled to the node K(n). The voltage at the driving node Q(n) is supplied to the gate terminal of the transistor T62 and the gate terminal of the transistor T64; wherein the gate terminal of the transistor T62 and the gate terminal of the transistor T64 are electrically coupled together. The second channel terminal of the transistor T62 and the second channel terminal of the transistor T64 are electrically coupled together to the predetermined voltage VSS1.

In the present embodiment, the first pull-down circuit 210a of the shift register 30 includes a transistor T42. The transistor T42 is configured to have the gate terminal electrically coupled to the node P(n) of the first pull-down control circuit 200a; the first channel terminal electrically coupled to the driving node Q(n); and the second channel terminal electrically coupled to the startup signal ST(n) which is generated by the shift register 30. According to the aforementioned circuit structure, the first pull-down circuit 210a can determine whether to conduct the electrical channel between the driving node Q(n) and the startup signal ST(n) or not according to the voltage at the node P(n). In the present embodiment, the second pull-down circuit 215a includes a transistor T44. The transistor T43 is configured to have the gate terminal electrically coupled to the node K(n) of the second pull-down control circuit 205a; the first channel terminal electrically coupled to the driving node Q(n); and the second channel terminal electrically coupled to the startup signal ST(n) which is generated by the shift register 30. According to the aforementioned circuit structure, the second pull-down circuit 215a can determine whether to conduct the electrical channel between the driving node Q(n) and the startup signal ST(n) or not according to the voltage at the node K(n).

In the present embodiment, the first driving node control circuit 230a includes a transistor T11. The transistor T11 is configured to have the gate terminal for receiving the startup signal ST(n−2) generated by the shift register two stages before the present-stage shift register (i.e., the shift register 30); the first channel terminal for receiving the output signal G(n−2) generated by the shift register two stages after the present-stage shift register (i.e., the shift register 30); and the second channel terminal electrically coupled to the driving node Q(n). According to the aforementioned circuit structure, the transistor T11 can determine whether to conduct the electrical channel between the output signal G(n−2) and the driving node Q(n) or not according to the startup signal ST(n−2). From another perspective, in the present embodiment the startup signal ST(n−2) is equivalent to the control signal B in the embodiment illustrated in FIG. 2; and the output signal G(n−2) is equivalent to the control signal A in the embodiment illustrated in FIG. 2. As a result, the first driving node control circuit 230a can determine whether to transmit the output signals G(n−2) to the driving node Q(n) according to the startup signal ST(n−2).

In the present embodiment, the first output terminal control circuit 220a includes transistors T12 and T21. The transistor T21 is configured to have the gate terminal electrically coupled to the driving node Q(n); the first channel terminal for receiving the clock signal HCn; and the second channel terminal electrically coupled to the first output terminal 225a and for timely pulling up the voltage at the first output terminal 225a and thereby changing the voltage level of the output signal G(n). That is, by controlling the voltage at the driving node Q(n) and the clock signal HCn, the output signal G(n) provided from the first output terminal control circuit 220a to the first output terminal 225a is controlled. Or, from another perspective, the first output terminal control circuit 220a can determine whether to transmit the clock signal HCn to the first output terminal 225a or not according to the voltage at the driving node Q(n).

In addition, the transistor T12 in the first output terminal control circuit 220a is configured to have the gate terminal electrically coupled to the driving node Q(n); the first channel terminal for receiving the clock signal HCn; and the second channel terminal for providing the startup signal ST(n).

Or, from another perspective, the second channel terminal of the transistor T12 for providing the startup signal ST(n) can be regarded as a second output terminal; and the function of the transistor T12 to the second output terminal is equivalent to the function of the transistor T21 to the first output terminal 225a. Accordingly, the transistor T21 can be considered as the first output terminal control circuit 220a; and the transistor T12 can be considered as the second output terminal control circuit. In addition, it is noted that the operations of the two output terminal control circuits are independent with each other without any mutual interference therebetween.

The operations among the first output terminal control circuit, the first output terminal, the first driving node control circuit and the second driving node control circuit will be described in detailed with a reference of timing diagrams. Please refer to FIGS. 3, 6A and 6B; wherein FIG. 6A is a timing diagram of the clock signals used in the shift register group in accordance with an embodiment of the present disclosure and FIG. 6B is a timing diagram of some specific signals used in the first-stage shift register in accordance with an embodiment of the present disclosure.

Figure 6A:
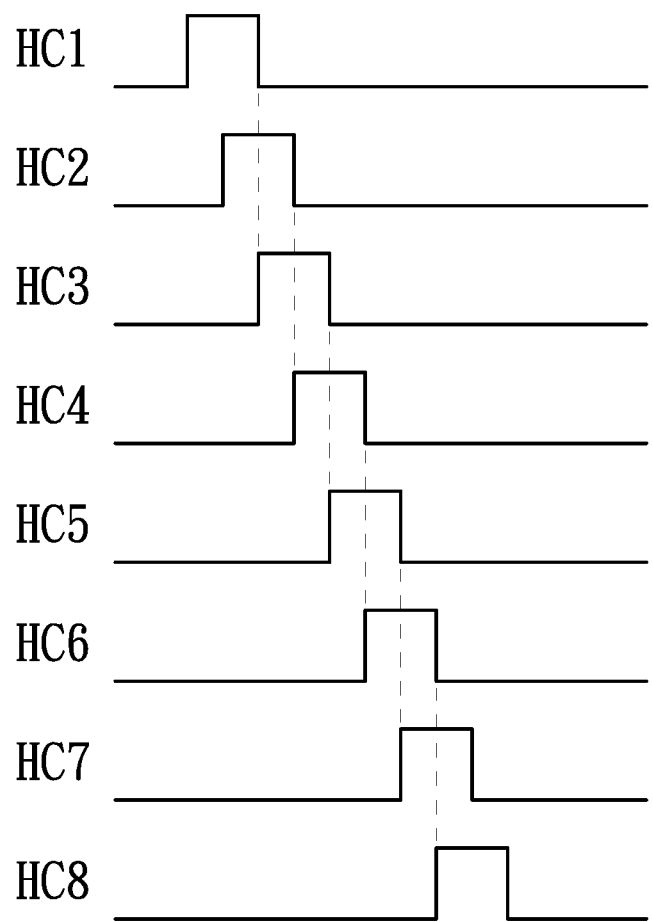
FIG. 6A is a timing diagram of the clock signals used in the shift register group in accordance with an embodiment of the present disclosure.

As illustrated in FIG. 6A, in the present embodiment, the clock signal HCn is referred to as the clock signal used in the nth-stage shift register. Specifically, it is noted that the enabled periods of the successive two clock signals supplied to the successive two shift registers, respectively, have an overlap therebetween; and the two clock signals supplied to the two shift registers having one shift register therebetween, respectively, have no overlap therebetween. For example, the enabled period of the clock signal HC1 supplied to the first-stage shift register and the enabled period of the clock signal HC2 supplied to the second-stage shift register partially overlap; the enabled period of the clock signal HC2 supplied to the second-stage shift register and the enabled period of the clock signal HC3 supplied to the third-stage shift register partially overlap; but the enabled period of the clock signal HC1 supplied to the first-stage shift register and the enabled period of the clock signal HC3 supplied to the third-stage shift register have no overlap. In addition, it is noted that the clock signals having the waveform configuration as illustrated in FIG. 6A are usually used for the two-dimensional image displaying. In addition, for brevity, only eight clock signals HC1~HC8 for the first-stage to eighth-stage shift registers, respectively, are exemplarily shown in FIG. 6A and the clock signals for the shift registers after the eighth-stage shift register are omitted. However, it is understood that the clock signals for the shift registers after the eighth-stage shift register may have the waveform configuration manner same as that of the clock signals HC1~HC8. In other words, the clock signal HC1 is provided for the (1+8*m)th-stage shift registers; the clock signal HC2 is provided for the (2+8*m)th-stage shift registers; the clock signal HC3 is provided for the (3+8*m)th-stage shift registers; the clock signal HC4 is provided for the (4+8*m)th-stage shift registers; the clock signal HC5 is provided for the (5+8*m)th-stage shift registers; the clock signal HC6 is provided for the (6+8*m)th-stage shift registers; the clock signal HC7 is provided for the (7+8*m)th-stage shift registers; the clock signal HC8 is provided for the (8+8*m)th-stage shift registers; wherein m is an integer equal to or greater than zero.

Figure 6B:
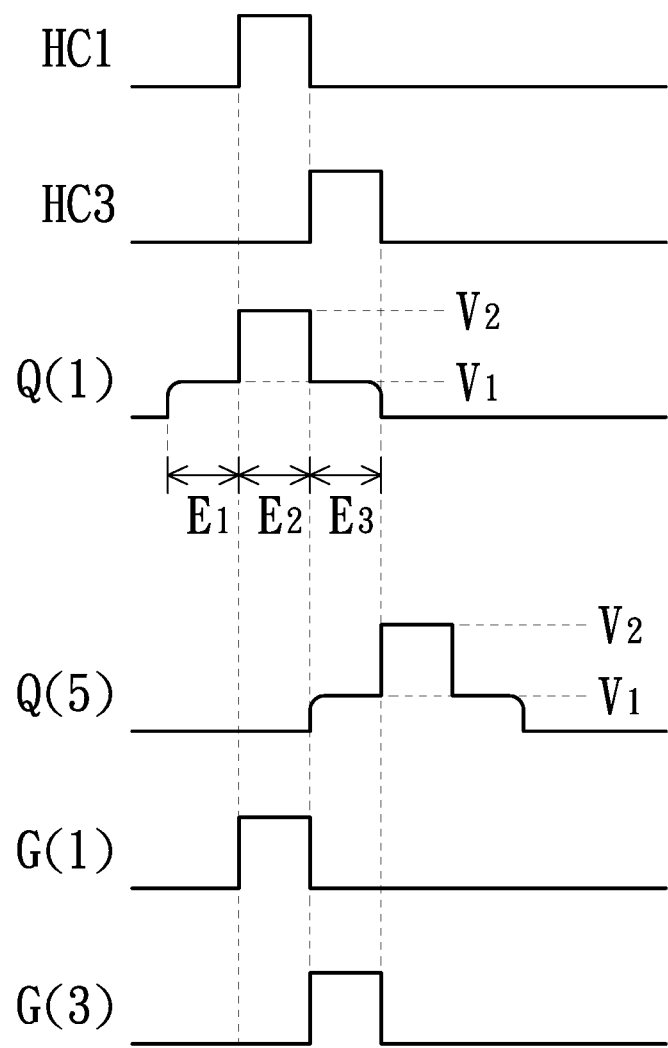
FIG. 6B is a timing diagram of some specific signals used in the first-stage shift register in accordance with an embodiment of the present disclosure.

Please refer to FIGS. 3, 6A and 6B. In the beginning of the time sequence, the first driving node control circuit 230a receives the startup signal ST(1-2) and the output signal G(1-2) provided from the shift register two stages before the present-stage shift register (ie., the first-stage shift register). Because both of the startup signal ST(1-2) and the output signal G(1-2) have logic-high levels, the logic-high output signal G(1-2) is transmitted to the driving node Q(1) through the turned-on transistor T11. Thus, the voltage at the driving node Q(1) is pulled up to a first voltage $V_1$; the transistors T12 and T21 are turned on; and the startup signal ST(1) and the output signal G(1) are approximately synchronized with the clock signal HC1 to have, for example, logic-low levels. Herein, it is noted that the startup signal ST(1-2) and the output signal G(1-2) provide to the first-stage shift register can be generated by some different ways. For example, in one embodiment, the startup signal ST(1-2) and the output signal G(1-2) may be generated by simulating, through dummy elements, the startup signal and the output signal outputted from the shift register two stages before the present-stage shift register (ie., the first-stage shift register). In another embodiment, the startup signal ST(1-2) and the output signal G(1-2) may be generated by the related signals outputted from the last one or more stages of shift register in the last frame. The startup signal ST(1-2) and the output signal G(1-2) may be generated by other different ways, and no redundant detail is to be given herein.

After the voltage at the driving node Q(1) is pulled up to the first voltage $V_1$, the transistor T11 is turned off by the decreasing of the voltage of the startup signal ST(1-2), and thereby the driving node Q(1) is in the floating state (it is noted that meanwhile the transistors T41, T42 and T43 are also turned off). Because the clock signal HC1 is converted from a logic-low level to a logic-high level, the voltage at the driving node Q(1) is further pulled up to a second voltage $V_2$ by the coupling effect of the transistors T12 and T21. At the same time, because the transistors T12 and T21 are still turned on, the startup signal ST(1) and the output signal G(1) are approximately synchronized with the clock signal HC1 to have, for example, logic-high levels.

Then, because the clock signal HC1 is converted from a logic-high level to a logic-low level, the voltage at the driving node Q(1) is pulled back from the second voltage $V_2$ to the first voltage $V_1$. At the same time, because the transistors T12 and T21 are still turned on, the startup signal ST(1) and the output signal G(1) are approximately synchronized with the clock signal HC1 to have, for example, logic-low levels.

In summary, the voltage at the driving node Q(1) is pulled up to the first voltage $V_1$ at a time point of one pulse period before the clock signal HC1 is being converted from a logic-low level to a logic-high level and is maintained to have the first voltage $V_1$ for a pulse period (this pulse period hereafter is referred to as the first period $E_1$). Then, because the clock signal HC1 is converted from a logic-low level to a logic-high level, the voltage of the driving node Q(1) is further pulled up to a second voltage $V_2$ and is maintained to have the second voltage $V_2$ for a pulse period (this pulse period hereafter is referred to as the second period $E_2$). Then, because the clock signal HC1 is converted from a logic-high level to a logic-low level, the voltage of the driving node Q(1) is pulled down back to the first voltage $V_1$ and is maintained to have the first voltage $V_1$ for a pulse period (this pulse period hereafter is referred to as the third period $E_3$). Then, the voltage of the driving node Q(1) is further pulled down back to a logic-low level in the next pulse period. In addition, it is noted that the startup signal ST(1) and the output signal G(1) are approximately synchronized with the clock signal HC1 in the present embodiment.

In addition, FIG. 6B also illustrates the time sequences of the voltage of the driving node Q(5) and the output signal G(3) used in the second driving node control circuit 240a of the first-stage shift register.

Please refer to FIGS. 3 and 6B. Meanwhile when the voltage at the driving node Q(1) is pulled down from the second voltage level $V_2$ back to the first voltage $V_1$ (or, the clock signal HC3 is converted form a logic-low level to a logic-high level), the voltage of the driving node Q(5) for controlling the turn-on/turn-off of the transistor T41 in the second driving node control circuit 240a is pulled up to the first voltage $V_1$. At the same time, the output signal G(3) is approximately pulled up to the logic-high clock signal HC3. In general, the voltage level of the logic-high clock signal HCn is higher than the voltage level of the first voltage $V_1$, the transistor T41 transmits the charges at the terminal for receiving the output signal G(3) to the terminal electrically coupled to the driving node Q(1).

In other words, the driving node Q(1) is not in a floating state when the driving node Q(1) in the third period $E_3$. In this way, not only the driving node Q(1) can be prevented from being affected by other signals or leakages but also the pull-down speed of the output signal G(1) is enhanced.

After the third period $E_3$ of the driving node Q(1), the voltage at the driving the node Q(5) firstly is pulled up to the second voltage $V_2$ and then gradually pulled down to the non-enable state (this specific period hereafter is referred to as a first recover period). Within the first recover period, the transistor T41 is turned on and accordingly the channel between the driving node Q(1) and the output signal G(3) is electrically conductive. More specifically, within the period while the voltage of the driving node Q(5) is pulled up to the second voltage $V_2$, because the gate terminal of the transistor T41 is driven by a relatively high voltage, the electrically-conductive channel between the driving node Q(1) and the output signal G(3) is maximum, thereby a higher speed for pulling down the voltage of the driving node Q(1) is achieved (because at this moment the output signal G(3) has a low voltage level).

In addition, by pulling down the voltage of the driving Q(1) with a relatively-high speed, the shift register is prevented from having error actions resulted by the output signal G(1) affected by other high-frequency signals.

Figure 4:
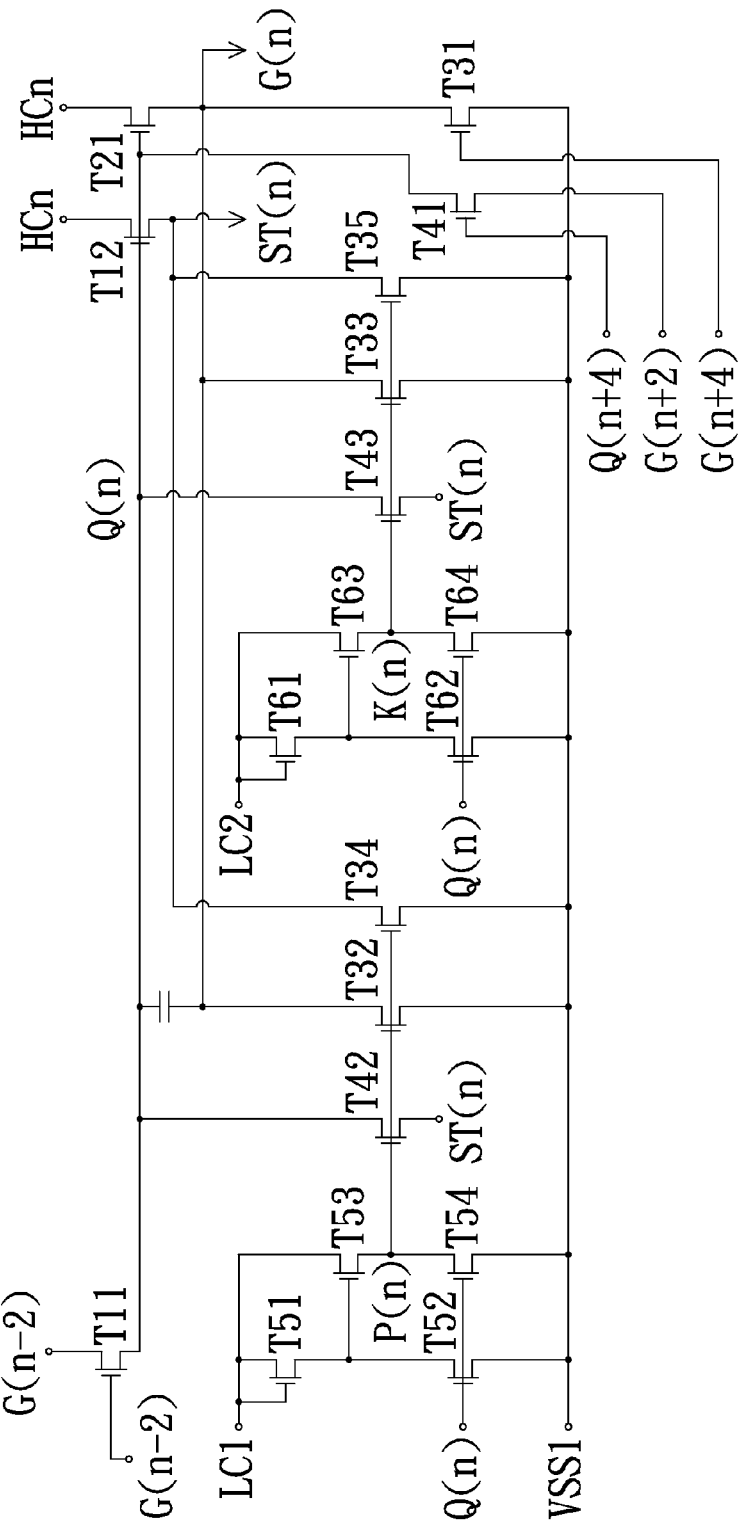
FIG. 4 is a schematic circuit view of a shift register in accordance with another embodiment of the present disclosure.
Figure 5:
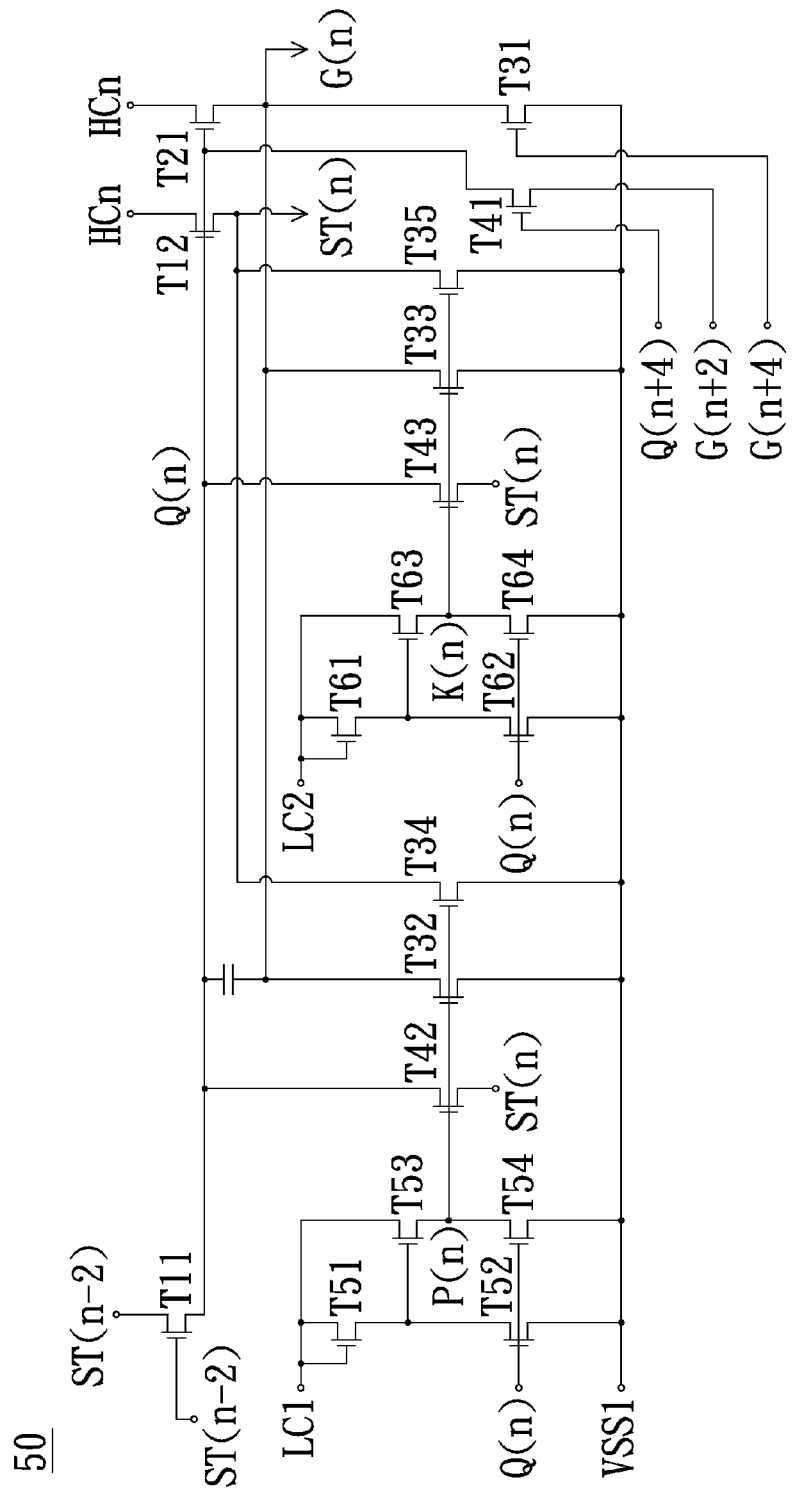
FIG. 5 is a schematic circuit view of a shift register in accordance with still another embodiment of the present disclosure.

The same operation principle can also apply to the shift registers in other embodiments shown in FIGS. 4 and 5. FIG. 4 is a schematic circuit view of a shift register in accordance with another embodiment of the present disclosure. As shown, the main difference between the shift register 40 in the present embodiment and the shift register 30 of FIG. 3 is: the gate terminal of the transistor T11 in FIG. 4 is for receiving the output signal G(n−2) but the gate terminal of the transistor T11 in FIG. 3 is for receiving the startup signal ST(n−2). From the above description, it is noted that the startup signal ST(n−2) and the output signal G(n−2) have similar enable periods; thus, the shift register 40 in the present embodiment of FIG. 4 has an operation same as that of the shift register 30 in the embodiment of FIG. 3; and no redundant detail is to be given herein.

FIG. 5 is a schematic circuit view of a shift register in accordance with still another embodiment of the present disclosure. As shown, the main difference between the shift register 50 in the present embodiment and the shift register 30 of FIG. 3 is: the first channel terminal of the transistor T11 in FIG. 5 is for receiving the startup signal ST(n−2) but the first channel terminal of the transistor T11 in FIG. 3 is for receiving the output signal G(n−2). From the above description, it is noted that the startup signal ST(n−2) and the output signal G(n−2) have similar enable periods; thus, the shift register 50 in the present embodiment of FIG. 5 has an operation same as that of the shift register 30 in the embodiment of FIG. 3; and no redundant detail is to be given herein.

Although the aforementioned embodiments are exemplified by using the output signal and/or the startup signal of the sift register two stages different with the present-stage shift register as the inputs of the present-stage shift register, the present disclosure is not limited thereto.

Figure 7A:
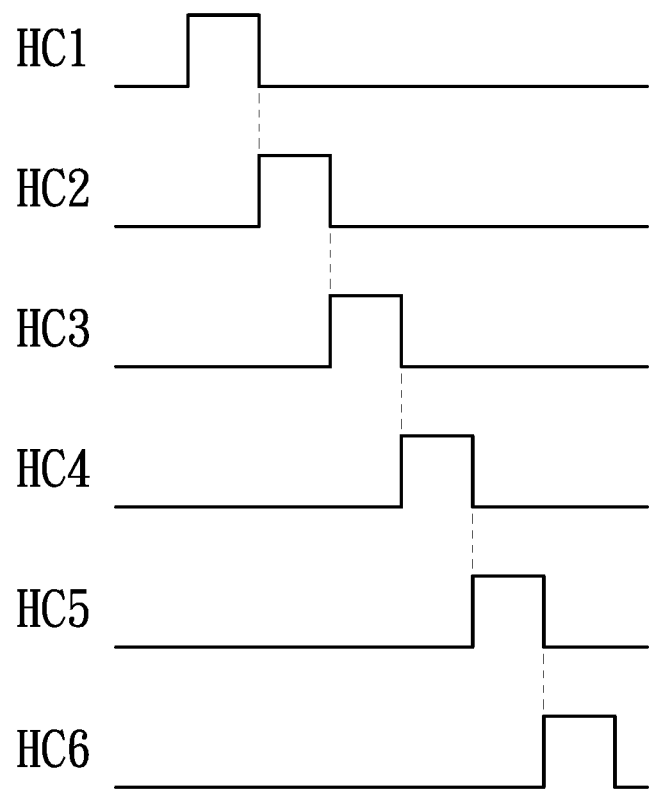
FIG. 7A is a timing diagram of the clock signals used in the shift register group in accordance with another embodiment of the present disclosure.

FIG. 7A is a timing diagram of the clock signals used in the shift register group in accordance with another embodiment of the present disclosure; wherein the clock signal HCn is referred to as the clock signal used in the nth-stage shift register. Specifically, it is noted that the enabled periods of the successive two clock signals supplied to the successive two shift registers, respectively, have no overlap. For example, the enabled period of the clock signal HC1 and the enabled period of the clock signal HC2 have no overlap; and the enabled period of the clock signal HC2 and the enabled period of the clock signal HC3 have no overlap. In addition, it is noted that the clock signals having the waveform configuration as illustrated in FIG. 7A are usually used for the two-dimensional image displaying. In addition, for brevity, only six clock signals HC1~HC6 for the first-stage to sixth-stage shift registers, respectively, are exemplarily shown in FIG. 7A and the clock signals for the shift registers after the sixth-stage shift register are omitted. However, it is understood that the clock signals for the shift registers after the sixth-stage shift register may have the waveform configurations same as that of the clock signals HC1~HC6. In other words, the clock signal HC1 is provided for the (1+6*m)th-stage shift registers; the clock signal HC2 is provided for the (2+6*m)th-stage shift registers; the clock signal HC3 is provided for the (3+6*m)th-stage shift registers; the clock signal HC4 is provided for the (4+6*m)th-stage shift registers; the clock signal HC5 is provided for the (5+6*m)th-stage shift registers; the clock signal HC6 is provided for the (6+6*m)th-stage shift registers; wherein m is an integer equal to or greater than zero.

Figure 7B:
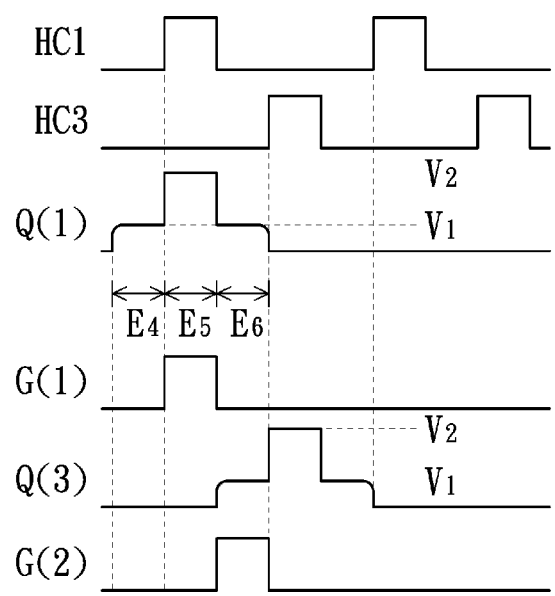
FIG. 7B is a timing diagram of some specific signals used in the first-stage shift register in accordance with another embodiment of the present disclosure.
Figure 7C:
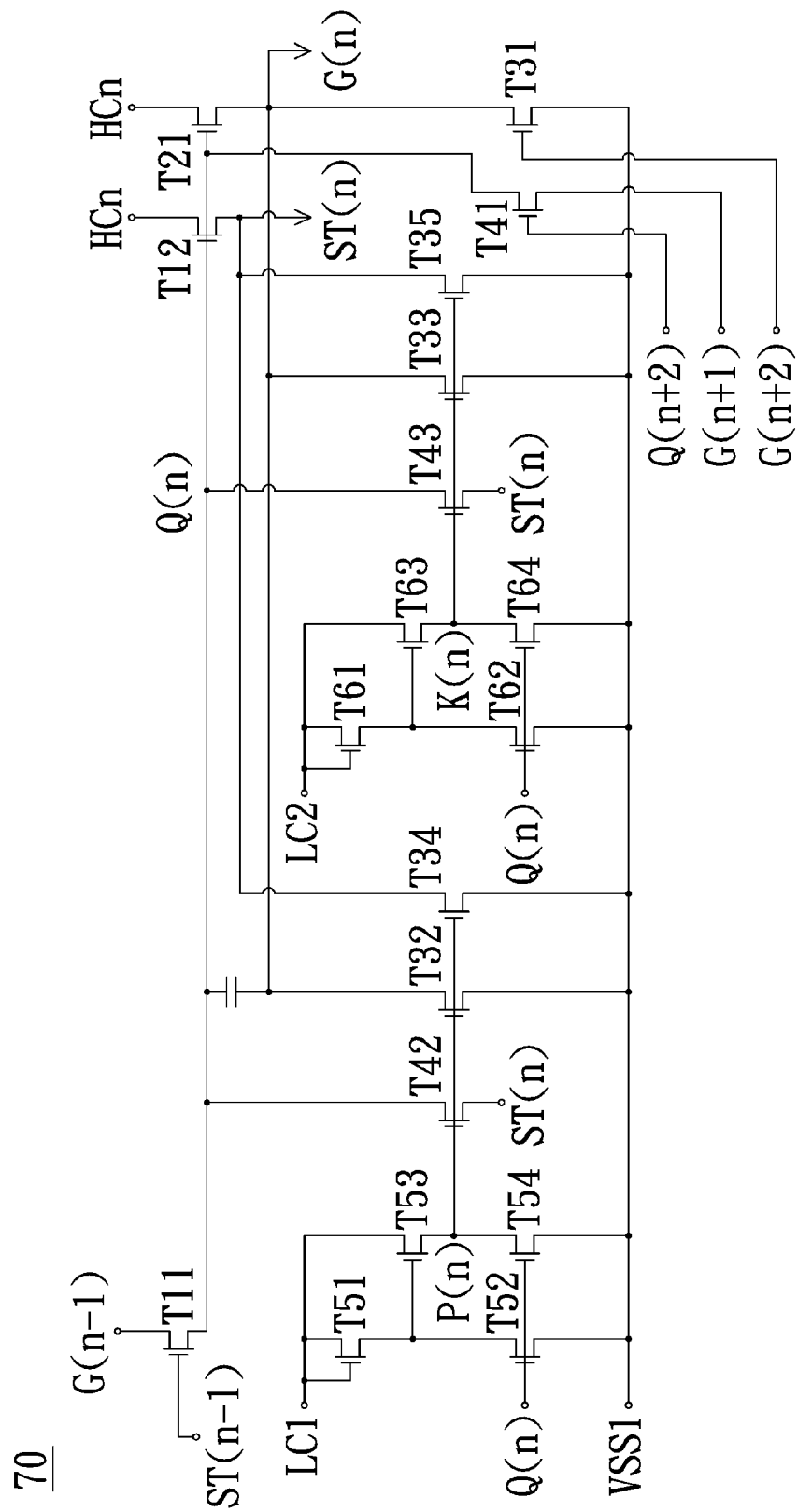
FIG. 7C is a schematic circuit view of a shift register in accordance with still another embodiment of the present disclosure.

Please refer to FIGS. 7B and 7C. FIG. 7B is a timing diagram of some signals used in the first-stage shift register disclosed in one embodiment of the present disclosure; and FIG. 7C is a circuit diagram of a shift register in accordance with one embodiment of the present disclosure. The main difference between the shift register 70 in the present embodiment of FIG. 7C and the shift register 30 of FIG. 3 is: the signals supplied to the transistors T11 and T41 in the shift register 70 are different with the signals supplied to the transistors T11 and T41 in the shift register 30. As shown in FIG. 7C, the signal supplied to the first channel terminal of the transistor T11 in the shift register 70 is the output signal G(n−1) provide by the shift register one stage before the present-stage shift register (i.e., the nth-stage shift register); the signal supplied to the gate terminal of the transistor T11 in the shift register 70 is the startup signal ST(n−1) provide by the shift register one stage before the present-stage shift register (i.e., the nth-stage shift register); the signal supplied to the second channel terminal of the transistor T41 in the shift register 70 is the output signal G(n+1) provide by the shift register one stage after the present-stage shift register (i.e., the nth-stage shift register); and the signal supplied to the gate terminal of the transistor T41 in the shift register 70 is the voltage at the driving node Q(n+2) in the shift register two stages after the present-stage shift register (i.e., the nth-stage shift register).

The function and circuit configuration of the other components in the shift register 70, such as the first pull-down control circuit, the second pull-down control circuit, the first pull-down circuit and the second pull-down circuit have been described above, and no redundant detail is to be given herein.

The following description will be described by using the first-stage shift register as an example, and accordingly the parameter n in FIGS. 7A, 7B and 7C is directly substituted by 1. Please refer to FIGS. 7A, 7B and 7C. In the beginning of the time sequence, the transistor T11 receives the startup signal ST(1-1) and the output signal G(1-1) provided by the shift register one stages before the present-stage shift register (ie., the first-stage shift register). Because both of the startup signal ST(1-1) and the output signal G(1-1) have logic-high levels, the logic-high output signal G(1-1) is transmitted to the driving node Q(1) through the turned-on transistor T11. Thus, the voltage at the driving node Q(1) is pulled up to a first voltage $V_1$ and is maintained to have the first voltage $V_1$ for a specific period (this specific period hereafter is referred to as the fourth period $E_4$); the transistors T12 and T21 are turned on; and the startup signal ST(1) and the output signal G(1) are approximately synchronized with the clock signal HC1 to have, for example, logic-low levels. Similarly, the startup signal ST(1-1) and the output signal G(1-1) provided to the first-stage shift register can be generated by some different ways. In one embodiment, for example, the startup signal ST(1-1) and the output signal G(1-1) may be generated by simulating, through dummy elements, the startup signal and the output signal outputted from the shift register one stage before the present-stage shift register (i.e., the first-stage shift register). In another embodiment, the startup signal ST(1-1) and the output signal G(1-1) may be generated by the associated signals outputted from the last one or more stages of shift register in the last frame. The startup signal ST(1-1) and the output signal G(1-1) may be generated by other different ways, and no redundant detail is to be given herein.

At the end of the fourth period $E_4$, the transistor T11 is turned off by the decreasing of the voltage of the startup signal ST(1-1), and thereby the driving node Q(1) is in the floating state (it is noted that meanwhile the transistors T41, T42 and T43 are also turned off). Thus, the voltage at the driving node Q(1) is pulled up to a second voltage $V_2$ and is maintained to have the second voltage $V_2$ for a specific period (this specific period hereafter is referred to as the fifth period $E_5$); the transistors T12 and T21 are turned on; and the startup signal ST(1) and the output signal G(1) are approximately synchronized with the clock signal HC1 to have, for example, logic-high levels.

Then, because the clock signal HC1 is converted from a logic-high level to a logic-low level, the voltage of the driving node Q(1) is pulled down back to the first voltage $V_1$ and is maintained to have the first voltage $V_1$ for a specific period (this specific period hereafter is referred to as the sixth period $E_6$). Because the transistors T12 and T21 are still turned on, the startup signal ST(1) and the output signal G(1) are approximately synchronized with the clock signal HC1 to have, for example, logic-low levels.

In summary, the voltage of the driving node Q(1) is sequentially pulled up to the first voltage $V_1$ in the fourth period $E_4$, further pulled up to the second voltage $V_2$ in the fifth period $E_5$, pulled down back to the first voltage $V_1$ in the sixth period $E_6$, and then pulled down back to the non-enable state in the next pulse period. In addition, it is noted that the startup signal ST(1) and the output signal G(1) are approximately synchronized with the clock signal HC1 in the present embodiment.

In addition, FIG. 7B also illustrates the time sequences of the voltage of the driving node Q(3) in the shift register two stages after the present-stage shift register (i.e., the first-stage shift register) and the output signal G(2) output from the shift register one stage after the present-stage shift register (i.e., the first-stage shift register).

Please refer to FIGS. 7B and 7C. Meanwhile when the voltage at the driving node Q(1) is pulled down from the second voltage level $V_2$ back to the first voltage $V_1$ (or, the clock signal HC2 is converted form a logic-low level to a logic-high level), the voltage of the driving node Q(3), for controlling the turn-on/turn-off of the transistor T41 (equivalent to the second driving node control circuit), is pulled up to the first voltage $V_1$. At the same time, the output signal G(2) is approximately pulled up to the logic-high clock signal HC2. Because both of the voltage of the driving node Q(3) (in general, the aforementioned first voltage $V_1$ is about 25V and the second voltage $V_2$ is about 60V) and the output signal (about 30V~−10V) have logic-high levels, the transistor T41 transmits the charges at the terminal for receiving the output signal G(2) to the terminal electrically coupled to the driving node Q(1). Thus, the driving node Q(1) in the sixth period $E_6$ is not in a floating state. In this way, not only the driving node Q(1) can be prevented from being affected by other signals or leakages but also the pull-down speed of the output signal G(1) is enhanced.

After the sixth period $E_6$, the output signal G(2) is pulled down to the non-enable state and the voltage at the driving the node Q(3) firstly is pulled up to the second voltage $V_2$ and then gradually pulled down to the non-enable state (this specific period hereafter is referred to as a second recover period). Within the second recover period, the transistor T41 is turned on and accordingly the path between the driving node Q(1) and the output signal G(2) is electrically conductive. More specifically, within the period while the voltage at the driving node Q(3) is pulled up to the second voltage $V_2$, because the gate terminal of the transistor T41 is driven by a relatively high voltage, the electrically-conductive path between the driving node Q(1) and the output signal G(2) is maximum, thereby a higher speed for pulling down the voltage of the driving node Q(1) is achieved (because at this moment the output signal G(3) has a low voltage level). In addition, by pulling down the voltage of the driving Q(1) with a relatively-high speed, the shift register is prevented from having error actions resulted by the output signal G(1) affected by other high-frequency signals.

In summary according to the aforementioned embodiments, when the first control signal and the second control signals of the present-stage shift register are the output signal G(n−N) and/or the startup signal ST(n−N) of the shift register N stages before the present-stage shift register, the third control signal used in the present-stage shift register is the output signal G(n+N) provided by the shift register N stages after the present-stage shift register and the fourth control signal used in the present-stage shift register is the voltage of the driving node Q(n+2N) of the shift register 2N stages after the present-stage shift register; wherein N is a natural number.

Figure 8A:
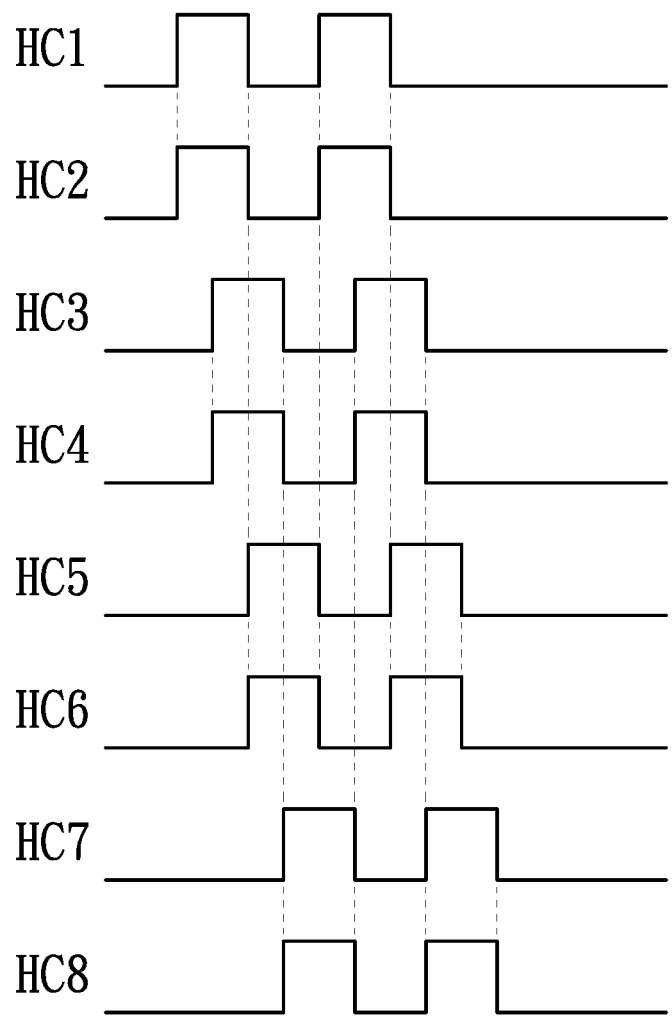
FIG. 8A is a timing diagram of the clock signals used in the shift register group in accordance with still another embodiment of the present disclosure.

Besides the aforementioned clock signals, some of the aforementioned disclosed shift registers still have similar functions by using other clock signals with specific waveforms. For example, please refer to FIG. 8A, which is a timing diagram of the clock signals used in the shift register group in accordance with still another embodiment of the present disclosure; wherein the clock signal HCn is referred to as the clock signal used in the nth-stage shift register and the clock signals of FIG. 8A are specifically used for three-dimensional images displaying. As illustrated in FIG. 8A, each clock signal has two pulses in one frame, and the two pulses have one pulse period therebetween. In addition, the clock signals are divided into a plurality of groups each including successive two clock signals. The two clock signal in the same group have the same waveform and phase, and the pulses of two clock signals respectively in the successive two groups have a half of pulse period therebetween. For example, the clock signals HC1 and HC2 are in the same group; the clock signals HC3 and HC4 are in the same group; the clock signals HC1 and HC2 in the same group have the same waveform and phase; and the pulse of the clock signal HC1 in one group and the pulse of the clock signal HC3 in the next group have a half of pulse period therebetween. In addition, for brevity, only eight clock signals HC1~HC8 for the first-stage to eighth-stage shift registers, respectively, are exemplarily shown in FIG. 8A and the clock signals for the shift registers after the eighth-stage shift register are omitted. However, it is understood that the clock signals for the shift registers after the eighth-stage shift register may have the waveform configurations same as that of the clock signals HC1~HC8. In other words, the clock signal HC1 is provided for the (1+8*m)th-stage shift registers; the clock signal HC2 is provided for the (2+8*m)th-stage shift registers; the clock signal HC3 is provided for the (3+8*m)th-stage shift registers; the clock signal HC4 is provided for the (4+8*m)th-stage shift registers; the clock signal HC5 is provided for the (5+8*m)th-stage shift registers; the clock signal HC6 is provided for the (6+8*m)th-stage shift registers; the clock signal HC7 is provided for the (7+8*m)th-stage shift registers; the clock signal HC8 is provided for the (8+8*m)th-stage shift registers; wherein m is an integer equal to or greater than zero.

Figure 8B:
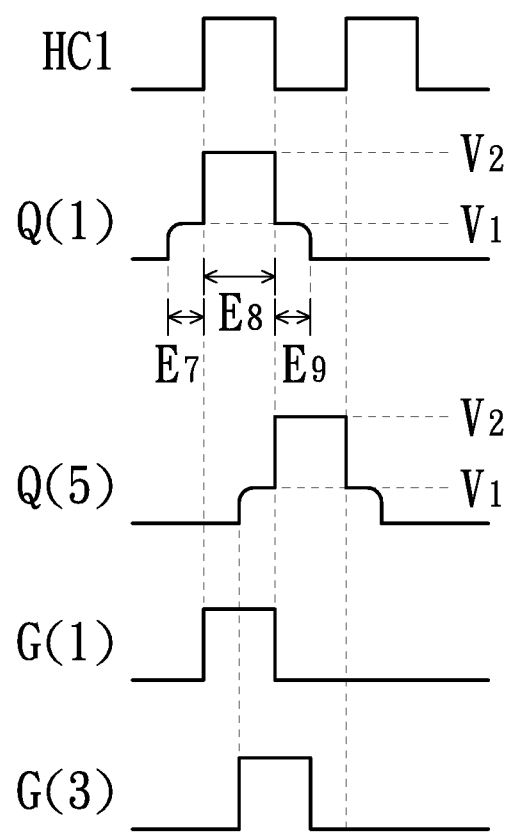
FIG. 8B is a timing diagram of some specific signals used in the first-stage shift register in accordance with still another embodiment of the present disclosure.

Please refer to FIGS. 3, 8A and 8B. FIG. 8B is a timing diagram of some signals used in the first-stage shift register disclosed in one embodiment of the present disclosure. The following description will be described by using the first-stage shift register as an example, and accordingly the parameter n in FIGS. 3, 8A and 8B is directly substituted by 1. Further, the function and circuit configuration of the first pull-down control circuit 200a, the second pull-down control circuit 205a, the first pull-down circuit 210a and the second pull-down circuit 215a have been described above, and no redundant detail is to be given herein.

In the beginning of the time sequence shown in FIG. 8B, the first driving node control circuit 230a in the shift register 30 of FIG. 3 receives the startup signal ST(1-2) and the output signal G(1-2) provided by the shift register two stages before the present-stage shift register (ie., the first-stage shift register). Because both of the startup signal ST(1-2) and the output signal G(1-2) have logic-high levels, the logic-high output signal G(1-2) is transmitted to the driving node Q(1) through the turned-on transistor T11. Thus, the voltage at the driving node Q(1) is pulled up to a first voltage $V_1$; the transistors T12 and T21 are turned on; and the startup signal ST(1) and the output signal G(1) are approximately synchronized with the clock signal HC1 to have, for example, logic-low levels. In the present embodiment, it is to be noted that the clock signals have specific waveform configurations as illustrated in FIG. 8A; that is, the clock signal used in the shift register two stages before the present-stage shift register (ie., the first-stage shift register) actually has only a half pulse different with the clock signal HC1 used in the first shift register. In addition, because the startup signal and the output signal are approximately synchronized with the first pulse of the respective clock signal, both of the startup signal ST(1-2) and the output signal G(1-2) are pulled up to logic-high levels approximately at a time point of a half pulse period before the first enabled pulse of the clock signal HC1 in the present frame and are maintained to have the logic-high level for a specific period (this specific period hereafter is referred to as the seventh period $E_7$). Accordingly, the voltage at the driving node Q(1) starts to be pulled up approximately at a time point of a half pulse period before the first enabled pulse of the clock signal HC1. It is to be noted that, compared with the present embodiment, the voltage at the driving node Q(1) starts to be pulled up approximately at a time point of one half pulse period before the first enabled pulse of the clock signal HC1.

At the end of the seventh period $E_7$, because the clock signal HC1 is converted from a logic-low level to a logic-high level, the voltage of the driving node Q(1) is further pulled up to a second voltage $V_2$ by the coupling effect of the transistors T12 and T21 and is maintained to have the second voltage $V_2$ for a specific period (this specific period hereafter is referred to as the eighth period $E_8$). Specifically, in the beginning period of the eighth period $E_8$ while the transistor T11 is turned on due to both of the startup signal ST(1-2) and the output signal G(1-2) have logic-high levels, because the voltage difference between the gate terminal and the first channel terminal of the transistors T11 is close to zero and the voltage difference between the first and second channel terminals of the transistor T11 is relatively small, the current flowing through the transistor T11 is relatively small; consequentially, the voltage of the driving node Q(1) pulled up to the second voltage $V_2$ will not have a relatively large voltage variation.

In the middle period of the eighth period $E_8$, because the clock signal HC(1-2) used in the shift register two stages before the present-stage shift register (ie., the first-stage shift register) is converted to a logic-low level, both of the startup signal ST(1-2) and the output signal G(1-2) are converted to logic-low levels and consequentially the transistor T11 is turned off.

Meanwhile in the middle period of the eighth period $E_8$, the voltage of the driving node Q(5) of the shift register four stages after the present-stage shift register (ie., the first-stage shift register) starts to be pulled up to the first voltage $V_1$ and the output signal G(3) received by one channel terminal of the transistor T41 is pulled up to a logic-high level along with the voltage configuration of the clock signal HC3. Under a general design requirement, as described above, the first voltage $V_1$ of the driving nodes Q(1) or Q(5) is about 25V; the second voltage $V_2$ of the driving nodes Q(1) or Q(5) is about 60V; and the logic-high level of the output signal of the driving nodes Q(1) or Q(5) is about 30V. Thus, the bias voltage, either the gate-source bias voltage or the gate-drain bias voltage, supplied to the transistor T41 is smaller than zero; and meanwhile the transistor T41 is also turned off.

Thus, after the middle period of the eighth period $E_8$, the voltage of the driving node Q(1) is relatively stable due to being equivalent in a floating state.

At the end of the eighth period $E_8$, because the clock signal HC1 is converted from a logic-high level to a logic-low level, the voltage at the driving node Q(1) is pulled down back to the first voltage $V_1$ by the coupling effect and is maintained to have the first voltage $V_1$ for a specific period (this specific period hereafter is referred to as the ninth period $E_9$). In the ninth period $E_9$, because the voltage at the driving node Q(1) is maintained at the first voltage V1, the transistor T21 is still turned on and is functioned as a discharging path for the output signals G(1). In the meantime, because the voltage at the driving node Q(5) is pulled up to the second voltage $V_2$ and the transistor T41 is turned on, the voltage at the driving node Q(1) will be affected by the output signal G(3). In other words, through adjusting the waveform of the output signal G(3), the voltage at the driving node Q(1) in the ninth period $E_9$ can be modulated.

In the conventional shift register, it is noted that the voltage at the driving node Q(1) at the end of the eighth period $E_8$ is directly pulled down to be close to the last low voltage level. Therefore, within the ninth period $E_9$, the conventional shift register cannot use the transistor T21 as a discharging path for the output signal G(1) and the only one discharging path for the output signal G(1) is the transistor T31. As a result, the transistor T31 in the conventional shift register must be designed to have a relatively large element size for the high discharging speed resulted in a high frequency operation. On the contrary, by using the design mode disclosed in the aforementioned embodiments, both of the transistor T31 and T21 can be used as the discharging path for the output signal G(1). Since the transistor T31 is not the only one discharging path for the output signal G(1), the transistor T31 can be designed to have a relatively small element size under the same discharging speed, and consequentially the overall associated circuit size is reduced.

In addition, because the driving node Q(1) in the ninth period of $E_9$ is not in a floating state, not only the driving node Q(1) can be prevented from being affected by other signals or leakages but also the pull-down speed of the output signal G(1) is enhanced by using the transistor T21.

Moreover, it is noted that the second pulse of each clock signal in each frame actually does not result in any additional effect on the respect shift register while the aforementioned operation are being performed, and no redundant detail is to be given herein.

From another perspective, it is understood that a method for driving a shift register group is provided by the present disclosure based on the aforementioned embodiments; wherein the shift register group includes at least one shift register disclosed in the aforementioned embodiments.

Figure 9:
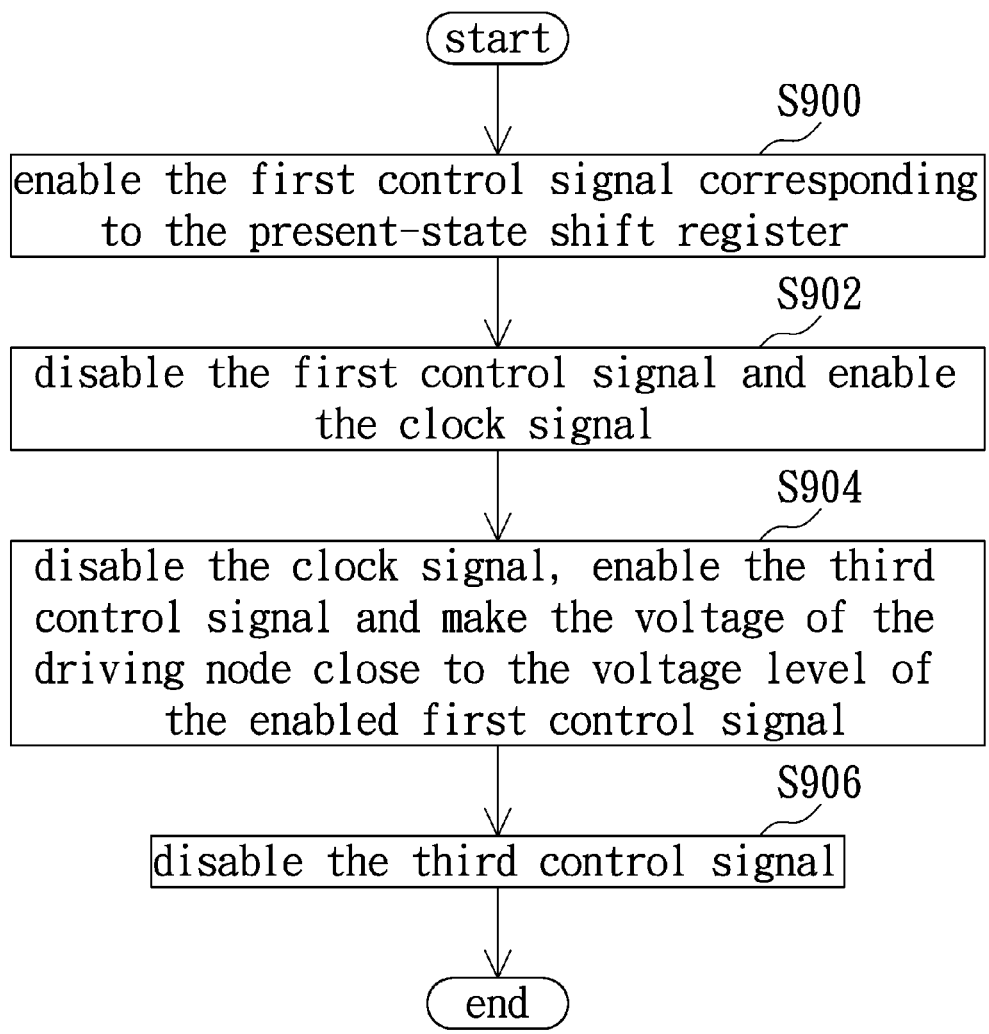
FIG. 9 is a flowchart illustrating a method for driving a shift register group in accordance with an embodiment of the present disclosure.

FIG. 9 is a flowchart illustrating a method for driving a shift register group in accordance with an embodiment of the present disclosure. As shown, the method in the present embodiment includes steps of: enabling a first control signal corresponding to a shift register (step S900); disabling the first control signal and enabling a clock signal after the first control signal is enabled a specific period (step S902); disabling the clock signal and enabling a third control signal after the clock signal is enabled a specific period and adjusting a voltage level of a fourth control signal based on an actual requirement, thereby making the voltage of a driving node close to the voltage level of the previous enabled first control signal (step S904); and disabling the third control signal after the step S904 is performed a specific period (step S906).

It is understood that the method of FIG. 9 is obtained by summary and integration of the aforementioned embodiment and is not limited to be used in any specific embodiment. In addition, it is understood that the timing diagrams shown in FIGS. 6A, 7A and 8A can be applied to the process disclosed in the method of FIG. 9.

Figure 10:
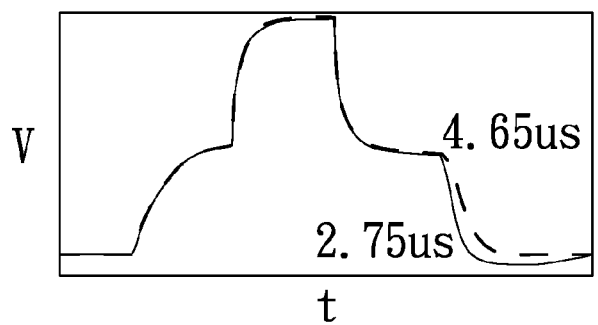
FIG. 10 is a schematic view illustrating a comparison of the waveform of the driving node of the shift register in accordance with one embodiment of the present disclosure with that in prior art.

According to the descriptions in the aforementioned embodiments, it is understood that the shift register of the present disclosure has improved performances. FIG. 10 is a schematic view illustrating a comparison of the waveform of the driving node of the shift register in accordance with one embodiment of the present disclosure with that in prior art; wherein the waveform obtained by the present embodiment is indicated by a solid line, and the waveform obtained by the prior art is indicated by a dotted line. As shown, the solid-line waveform can be converted from a logic-high level to a logic-low level in, for example, 3.04 microseconds and the dotted-line waveform can be converted from a logic-high level to a logic-low level in, for example, 4.85 microseconds. Thus, the signal at the driving node in the shift register provided by the embodiment of the present disclosure has a faster pull-down speed.

Figure 11:
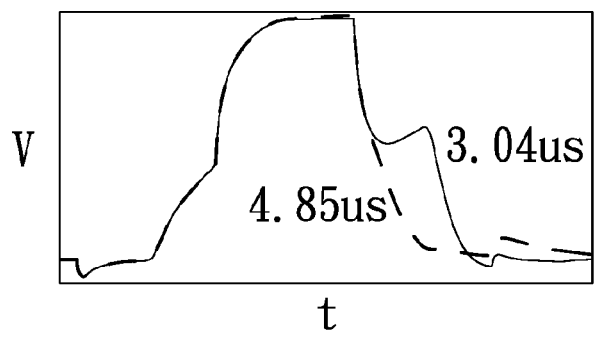
FIG. 11 is a schematic view illustrating a comparison of the waveform of the driving node of the shift register in accordance with one embodiment of the present disclosure with that in prior art.

FIG. 11 is a schematic view illustrating a comparison of the waveform at the driving node of the shift register in accordance with one embodiment (for example, obtained by the clock signals of FIG. 8A for being used in 3D images) of the present disclosure with that in prior art; wherein the waveform obtained by the present embodiment is indicated by a solid line, and the waveform obtained by the prior art is indicated by a dotted line. As shown, the solid-line waveform can be converted from a logic-high level to a logic-low level in, for example, 2.75 microseconds and the dotted-line waveform can be converted from a logic-high level to a logic-low level in, for example, 4.65 microseconds. Thus, the signal at the driving node in the shift register provided by the embodiment of the present disclosure has a faster pull-down speed.

Figure 12:
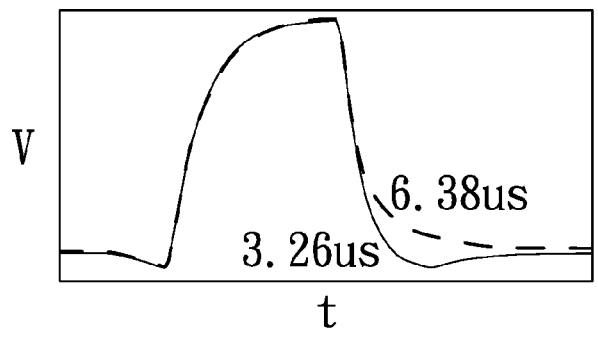
FIG. 12 is a schematic view illustrating a comparison of the waveform of the driving node of the shift register in accordance with one embodiment of the present disclosure with that in prior art.

FIG. 12 is a schematic view illustrating a comparison of the output signal waveform resulted by the shift register in accordance with one embodiment of the present disclosure with that in prior art; wherein the output signal waveform obtained by the present disclosure is indicated by a solid line, and the output signal waveform obtained by the prior art is indicated by a dotted line. As shown, the solid-line waveform can be converted from a logic-high level to a logic-low level in, for example, 3.26 microseconds and the dotted-line waveform can be converted from a logic-high level to a logic-low level in, for example, 6.38 microseconds. Thus, the output signal of the shift register provided by the embodiment of the present disclosure has a faster pull-down speed.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shift register group, the shift register group comprising a plurality of series-coupled shift registers each being configured to provide an output signal, each one of the plurality of shift registers comprising:
    a first output terminal, configured to provide the output signal;
    a first output terminal control circuit, electrically coupled to the first output terminal and configured to receive a clock signal and determine whether to transmit the clock signal to the first output terminal or not according to a voltage at a driving node;
    a first driving node control circuit, electrically coupled to the driving node and configured to receive a first control signal and determine whether to transmit the first control signal to the driving node or not according to a second control signal; and
    a second driving node control circuit, electrically coupled to the driving node and configured to receive a third control signal and determine whether to transmit the third control signal to the driving node or not according to a fourth control signal,
    wherein the third control signal of a first sift register of the plurality of shift registers is the output signal provided by the shift register N stages after the first shift register, and the fourth control signal of the first sift register is the voltage at the driving node of the shift register 2N stages after the first shift register, wherein N is a natural number,
    wherein the plurality of shift registers are divided into a plurality of groups each consisting of two shift registers, the two shift registers in the same group are corresponding to the same clock signal, an enable period of the clock signal corresponding to a specific group comprising the first shift register and an enable period of the clock signal corresponding to a group last the specific group partially overlap, and the enable period of the clock signal corresponding to the group last the specific group and an enable period of the clock signal corresponding to a group next the specific group do not overlap.

2. The shift register group according to claim 1, wherein the second driving node control circuit comprises:
    a transistor, comprising a control terminal, a first channel terminal and a second channel terminal, the transistor being configured to have the control terminal for receiving the fourth control signal, the first channel terminal electrically coupled to the driving node, and the second channel terminal for receiving the third control signal.

3. The shift register group according to claim 2, wherein the first control signal of the first shift register is the output signal provided by the shift register N stages before the first shift register.

4. The shift register group according to claim 1, wherein each one of the plurality of shift registers further comprises:
    a second output terminal, configured to provide a startup signal; and
    a second output terminal control circuit, electrically coupled to the second output terminal and configured to receive the clock signal and determine whether to transmit the clock signal to the second output terminal or not according to the voltage of the driving node.

5. A shift register group, the shift register group comprising a plurality of series-coupled shift registers coupled each being configured to provide an output signal, each one of the plurality of shift registers comprising:
    a first output terminal, configured to provide the output signal;
    a first output terminal control circuit, electrically coupled to the first output terminal and configured to receive a clock signal and determine whether to transmit the clock signal to the first output terminal or not according to a voltage at a driving node;
    a first driving node control circuit, electrically coupled to the driving node and configured to receive a first control signal and determine whether to transmit the first control signal to the driving node or not according to a second control signal; and
    a second driving node control circuit, electrically coupled to the driving node and configured to receive a third control signal and determine, according to a fourth control signal, whether to have the driving node for performing a specific operation in respond to the third control signal or not;
    wherein the third control signal of a first sift register of the plurality of shift registers is the output signal provided by the shift register N stages after the first shift register, and the fourth control signal of the first sift register is the voltage at the driving node of the shift register 2N stages after the first shift register, wherein N is a natural number, wherein the plurality of shift registers are divided into a plurality of groups each consisting of two shift registers, the two shift registers in the same group are corresponding to the same clock signal, an enable period of the clock signal corresponding to a specific group comprising the first shift register and an enable period of the clock signal corresponding to a group last the specific group partially overlap, and the enable period of the clock signal corresponding to the group last the specific group and an enable period of the clock signal corresponding to a group next the specific group do not overlap.

6. The shift register group according to claim 5, wherein the second driving node control circuit comprises:
    a transistor, comprising a control terminal, a first channel terminal and a second channel terminal, the transistor being configured to have the control terminal for receiving the fourth control signal, the first channel terminal electrically coupled to the driving node, and the second channel terminal for receiving the third control signal.

7. The shift register group according to claim 6, wherein the first control signal of the first shift register is the output signal provided by the shift register N stages before the first shift register.

8. The shift register group according to claim 5, wherein the first control signal of the first shift register is the output signal provided by the shift register N stages before the first shift register.

9. The shift register group according to claim 5, wherein each one of the plurality of shift registers further comprises:
- a second output terminal, configured to provide a startup signal; and
- a second output terminal control circuit, electrically coupled to the second output terminal and configured to receive the clock signal and determine whether to transmit the clock signal to the second output terminal or not according to the voltage of the driving node.

* * * * *